(12) United States Patent
Yang et al.

(10) Patent No.: US 6,992,374 B1
(45) Date of Patent: Jan. 31, 2006

(54) TECHNIQUES FOR MANUFACTURING A CIRCUIT BOARD WITH AN IMPROVED LAYOUT FOR DECOUPLING CAPACITORS

(75) Inventors: Zhiping Yang, Santa Clara, CA (US); Vinayagam Arumugham, San Jose, CA (US); Lekhanh Dang, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/867,055

(22) Filed: Jun. 14, 2004

(51) Int. Cl.
*H01L 23/02* (2006.01)
*H01L 23/48* (2006.01)
*H01L 29/00* (2006.01)

(52) U.S. Cl. .................. 257/678; 257/686; 257/692
(58) Field of Classification Search ................ 257/533, 257/678–692
See application file for complete search history.

(56) References Cited

U.S. PATENT DOCUMENTS

| | | | |
|---|---|---|---|
| 6,108,212 A * | 8/2000 | Lach et al. .................. 257/533 |
| 6,239,482 B1 * | 5/2001 | Fillion et al. ............... 257/678 |
| 6,386,435 B1 | 5/2002 | Downes .................... 228/248.1 |
| 6,414,850 B1 * | 7/2002 | Kozak et al. ................ 257/723 |
| 6,535,005 B1 | 3/2003 | Field ........................... 324/755 |
| 6,736,308 B1 | 5/2004 | Downes .................... 228/248.1 |
| 2004/0061208 A1 * | 4/2004 | Quinlan et al. .............. 257/678 |
| 2004/0262716 A1 * | 12/2004 | Aoki ........................... 257/619 |
| 2005/0133930 A1 * | 6/2005 | Savastisuk et al. ......... 257/774 |

* cited by examiner

*Primary Examiner*—Cuong Nguyen
(74) *Attorney, Agent, or Firm*—BainwoodHuang; David E. Huang, Esq.

(57) ABSTRACT

A circuit board module has an IC device, discrete components, and a circuit board structure in electrical communication with the IC device and the discrete component. The circuit board structure includes non-conductive material defining a top surface of the circuit board structure and a bottom surface of the circuit board structure, vias supported by the non-conductive material, top pads electrically coupled to the vias, and bottom pads electrically coupled to the vias. The top pads are disposed along the top surface of the circuit board structure and are soldered to IC device. The bottom pads are disposed along the bottom surface of the circuit board structure and are configured to solder to the discrete components. The bottom pads include a group of angled bottom pads which is soldered to a group of the discrete components substantially at 45 degree angles relative to sides of the IC device.

16 Claims, 5 Drawing Sheets

TECHNIQUES FOR MANUFACTURING A CIRCUIT BOARD WITH AN IMPROVED LAYOUT FOR DECOUPLING CAPACITORS

BACKGROUND

A typical circuit board module includes a printed circuit board and a variety of circuit board components soldered to the printed circuit board. Examples of circuit board components include, among other things, (i) complex integrated circuit (IC) devices such as processors, memories, Application Specific Integrated Circuits (ASICs) and (ii) discrete components such as individual resistors, individual capacitors, and the like.

As complex IC device technologies evolve, such devices have tended to use faster signal edges and higher clock rates, and have become more sensitive due to reduced noise margins. As a result, circuit board manufacturers have followed a variety of conventional approaches to providing cleaner power supply signals (i.e., a ground reference, a positive DC voltage signal, etc.) to these complex IC devices.

One conventional approach to providing improved power supply signals (hereinafter referred to as the conventional lengthwise decoupling capacitor approach) involves the manufacturer installing power signal decoupling capacitors lengthwise within cross-patterns on the undersides of printed circuit boards. That is, for high density Area Array Package (AAP) devices such as Ball Grid Array (BGA) devices and Ceramic Column Grid Array Package (CCGA) devices, printed circuit boards typically have an array of cut-through vias (i.e., plated through holes) which connect traces within the printed circuit board (e.g., data lines, power planes, ground planes, etc.) to surface mount pads that solder to the AAP devices. Manufacturers typically offset these cut-through vias to leave a horizontal gap and a vertical gap (i.e., a cross-pattern) through the via array. Then, on the undersides opposite the mounting locations for the AAP devices, the manufacturers solder decoupling capacitors lengthwise within these horizontal and vertical gaps, i.e., with the long axes of the decoupling capacitors extending along the axes of the horizontal and vertical gaps. Accordingly, the decoupling capacitors are positioned in effective locations close to the vias and alleviate the need to consume additional circuit board space around the AAP devices. During operation, these decoupling capacitors reduce noise components within the power supply signals provided to the AAP devices (e.g., low to mid-frequency filtering) thus improving reliability of the complex IC devices.

Another conventional approach to providing improved power supply signals to complex IC device (hereinafter referred to as the conventional interleaved patterning approach) involves the manufacturers interleaving power supply signals through the cut-through vias. For example, suppose that several cut-through vias are configured to carry a positive DC voltage. The manufacturers attempt to configure the vias adjacent to these "power" cut-through vias so that they carry ground references. Similarly, for cut-through vias configured to carry the ground reference, the manufacturers attempt to configure the vias adjacent to these "ground" cut-through vias to carry positive DC voltage signals. Such interleaving of power and ground signals tends to minimize total loop inductance (i.e., capacitor mounting inductance and package loop inductance which are limiting factors on decoupling capacitor efficiency) and thus provides improved power signal conditioning.

SUMMARY

Unfortunately, there are deficiencies to the above-described conventional approaches to providing improved power supply signals to complex IC devices. For example, in the above-described conventional lengthwise decoupling capacitor approach, there is typically not enough space within the horizontal and vertical gaps for manufacturers to mount enough decoupling capacitors lengthwise for adequate power supply signal conditioning. As a result, the conditioning effects of above-described conventional lengthwise decoupling capacitor approach are limited.

Additionally, in the above-described conventional interleaved patterning approach, it is difficult for circuit board manufacturers to interleave power and ground cut-through vias for more than a few vias at a time due to geometry limitations between the vias. In particular, manufacturers have not found an appropriate arrangement for power signal traces on the surface of the circuit boards that enable the manufacturers to continue interleaving of power and ground cut-through vias beyond a few vias particularly when such power signal traces are forced to contend with decoupling capacitors mounted to the undersides of the circuit boards. Often, the need for a surface trace of one signal (e.g., a power signal) inhibits running an adjacent surface trace for a different signal (e.g., a ground signal) thus preventing further interleaving of the power and ground cut-through vias. Thus, manufacturers attempting to use interleave power and ground pins to minimize the total package loop inductance are only able to place a few decoupling capacitors underneath complex ICs such as BGAs and CCGAs. As a result, conventional power and ground interleaving approaches typically due not provide via patterns and pin/ball/column patterns that robustly work to minimize via inductance and pin inductance.

In contrast to the above-described conventional approaches for providing improved power supply signals to complex IC devices, embodiments of the invention are directed to techniques involving the use of angled pads which solder discrete components substantially at 45 degree angles relative to sides of integrated circuit devices. The use of these angled pads enables positioning of decoupling capacitors in locations other than simply within the horizontal and vertical gaps on the undersides of circuit boards opposite the mounting locations of complex IC devices. For example, in some layouts, decoupling capacitors are now capable of residing within quadrants defined by these gaps thus enabling circuit board designers and manufacturers to mount more decoupling capacitors for improved power supply signal conditioning (e.g., improved fan-out, filtering, etc.). Furthermore, the surface traces connecting these angled pads to their corresponding vias are capable of being arranged so that power and ground vias can be interleaved in an extended manner thus minimizing the total loop inductance for the circuit boards.

One embodiment is directed to a circuit board module having an integrated circuit device (e.g., a BGA device), discrete components (e.g., decoupling capacitors), and a circuit board structure in electrical communication with the integrated circuit device and the discrete component. The circuit board structure includes non-conductive material defining a top surface of the circuit board structure and a bottom surface of the circuit board structure, vias supported by the non-conductive material, top pads electrically coupled to the vias, and bottom pads electrically coupled to the vias. The top pads are disposed along the top surface of the circuit board structure and are soldered to the integrated circuit device. The bottom pads are disposed along the bottom surface of the circuit board structure and are configured to solder to the discrete components. The bottom pads include a group of angled bottom pads which is soldered to a group of the discrete components substantially at 45 degree angles relative to sides of the integrated circuit device. Such an arrangement enables mounting of a large number of decoupling capacitors for enhanced power signal conditioning for the integrated circuit device.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to circuit board design and manufacturing techniques involving angled pads which solder discrete components substantially at 45 degree angles relative to sides of integrated circuit devices. The use of these angled pads enables positioning of decoupling capacitors in locations other than simply within the horizontal and vertical gaps on the undersides of circuit boards opposite the mounting locations of complex IC devices. For example, decoupling capacitors are now capable of residing within quadrants defined by these gaps thus enabling circuit board manufacturers to mount more decoupling capacitors for improved power supply signal conditioning. Furthermore, the surface traces connecting these angled pads to their corresponding vias are capable of being arranged so that power and ground vias can be interleaved in an extended manner thus minimizing the total loop inductance for the circuit boards.

Figure 1:
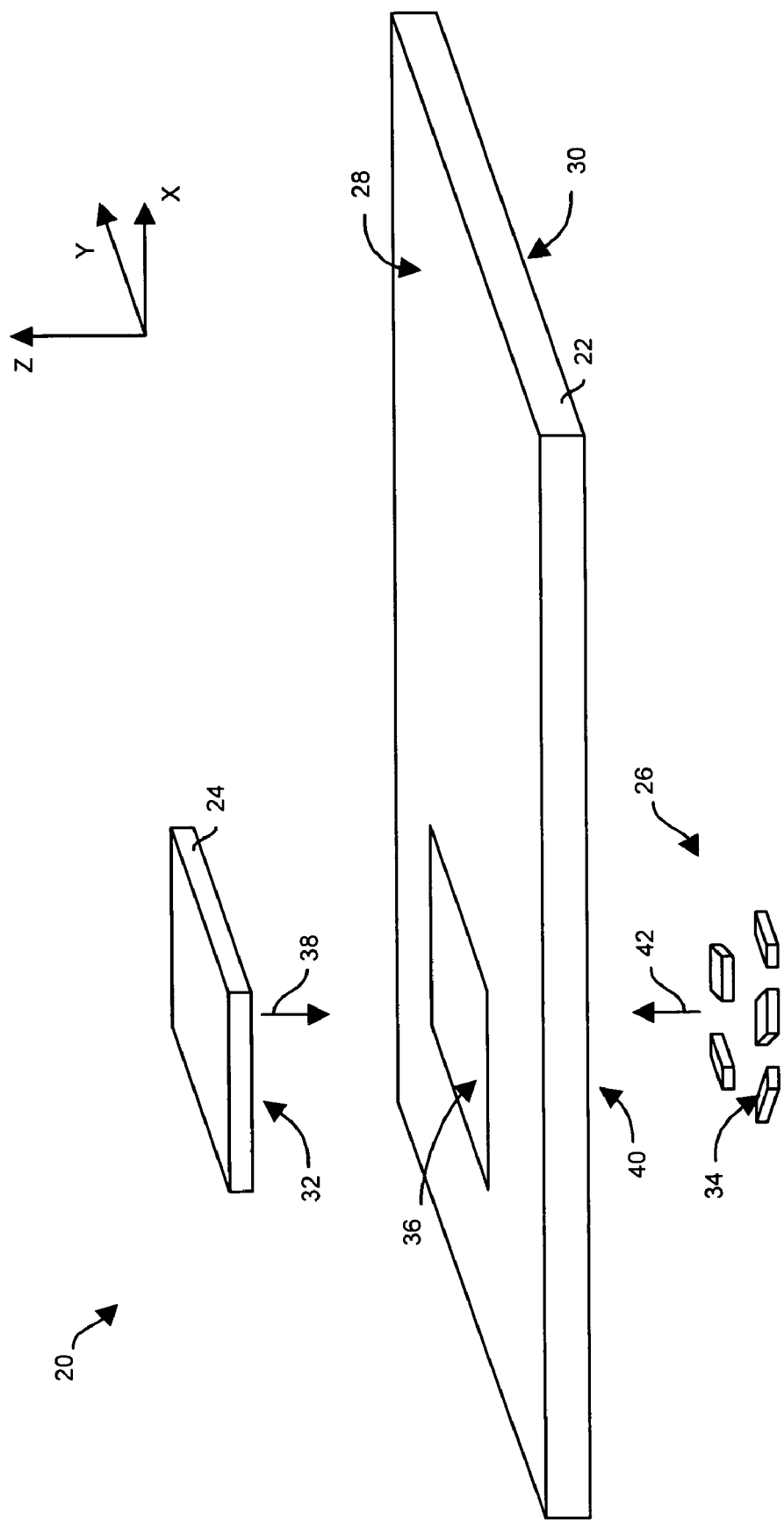
FIG. 1 is perspective view of a circuit board module which is suitable for use by the invention.

FIG. 1 shows a circuit board module 20 which is suitable for use by the invention. The circuit board module 20 includes a circuit board structure 22, an integrated circuit (IC) device 24 and a set of discrete components 26. The circuit board structure 22 (e.g., layers of non-conductive and conductive PCB material sandwiched together with appropriate tooling features, platings, coatings, etc. for robust and reliable assembly with circuit board components) is planar in shape along the X-Y plane and defines a top surface 28 and a bottom surface 30.

The IC device 24 is rectangular in shape (e.g., square) and includes an interface 32 which is configured to form a set of high density electrical connections with the circuit board structure 22. In some arrangements, the IC device 24 is an Area Array Package (AAP) (e.g., a BGA package or a CCGA package) containing semiconductor circuitry. In these arrangements, the interface 32 includes an array of device contacts (e.g., pins, balls, columns, etc.) which connect to corresponding circuit board contacts through solder joints.

Similarly, the discrete components 26 are rectangular in shape and include interfaces 34 which are configured to form electrical connections with the circuit board structure 22. In one arrangement, the discrete components 26 have small standard-sized packages (e.g., ceramic 0402 packages) containing electrical circuitry (e.g., individual decoupling capacitors).

As shown in FIG. 1, a component mounting location 36 along the top surface 28 is configured to connect to the interface 32 of the IC device 24 during a circuit board assembly phase. In one arrangement, while other circuit board components concurrently mount to other mounting locations, the IC device 24 solders to the mounting location 36 during an automated circuit board assembly process (e.g., automated equipment prints solder paste over the mounting location 36, pick-and-place equipment positions the IC device 24 in contact with the printed solder paste, an oven applies heat to activate flux and melt solder in the solder paste to form a set of solder joints, etc.). This automated circuit board assembly process is illustrated by the arrow 38 in FIG. 1.

Similarly, an area 40 which is opposite to the mounting location 36 and which is along the bottom surface 30 is configured to mount to the interfaces 34 of the discrete components 26 during the circuit board assembly phase. In particular, the discrete components 26 solder to the area 40 during an automated circuit board assembly process which is different than that for soldering the IC device 24 to the mounting location 36. The automated circuit board assembly process for mounting the discrete components 26 to the area 40 is illustrated by the arrow 42 in FIG. 1. In one arrangement, the circuit board manufacturer initially mounts the discrete components 26 to the area 42 using high temperature solder, and then mounts the IC device 24 to the mounting location 36 using relatively lower temperate solder and a relatively lower temperature soldering process to avoid substantial reflow of the high temperature solder holding the discrete components 26 to the area 40. Accordingly, the discrete components 26 remain soldered to the area 40 when the IC device 24 mounts to the circuit board structure 22.

It should be understood that the area 40 is configured to solder to the discrete components 26 such that at least some of the discrete components 26 reside substantially at 45 degree angles relative to sides of the IC device 24. Such a configuration enables some discrete components 26 to mount in the area 40 opposite the mounting location 36 but in portions of the area 40 other than the horizontal and vertical mid-lines of the area 40. Rather, discrete components 26 are capable of residing within quadrants defined by these gaps thus enabling circuit board manufacturers to mount more discrete components 26, e.g., more decoupling capacitors for enhanced power supply signal conditioning. Furthermore, power and ground vias associated with these decoupling capacitors (as well as the power and ground pins of the device 24) are capable of being arranged in an interleaved manner thus minimizing the total loop inductance for the circuit boards. Further details of the invention will now be provided with reference to FIG. 2.

Figure 2:
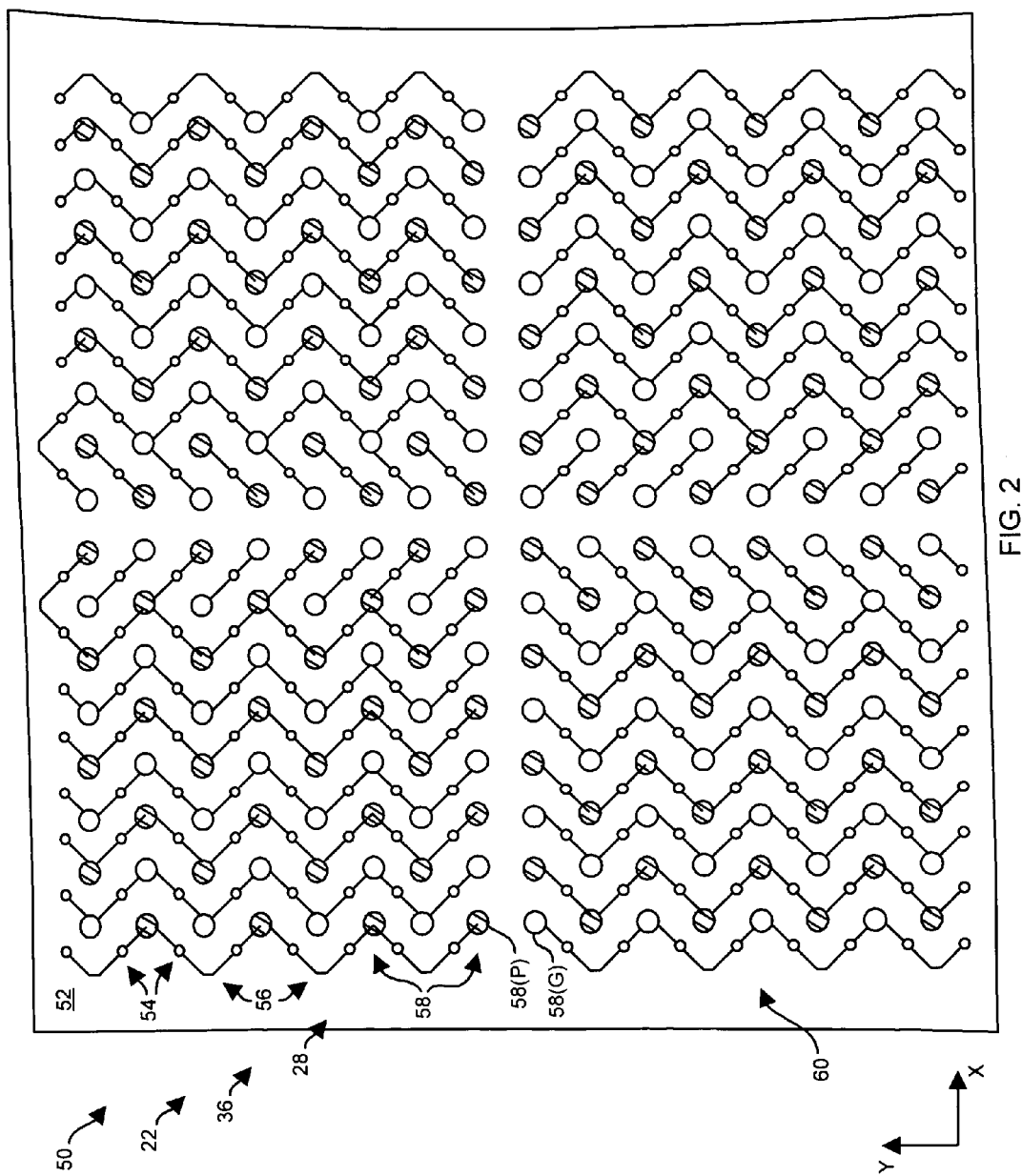
FIG. 2 is a top view of a component mounting location of a circuit board structure of the circuit board module of FIG. 1.

FIG. 2 is a top view 50 of the component mounting location 36 of the circuit board structure 22 (i.e., a top layer power/ground pin fanout scheme). As shown in FIG. 2, the circuit board structure 22 includes, among other things, non-conductive material 52, a set of vias (or plated-through holes) 54, a set of surface traces 56, and a set of pads 58. The non-conductive material 52 defines the top surface 28 (also see FIG. 1), and provides support for the vias 54, the traces 56 and the pads 58. The vias 54 extend perpendicularly through the circuit board structure 22 in the Z-direction and provide electrical pathways through the conductive and non-conductive layers of the circuit board structure 22 (e.g., to connect the surface traces 56 to inner conductive layers, to connect inner traces together, etc.). The surface traces 56 reside on the top surface 28 and connect the pads 58 to the vias 54. The pads 58 reside on the top surface 28 and are configured to solder to the IC device 24 (e.g., using an SMT process, also see FIG. 1). The IC device 24 is omitted from FIG. 2 in order to show other various details.

Some pads 58 are configured to carry a power signal P (e.g., pads 58 which connect to power planes of the circuit board structure 22) and are shown in FIG. 2 as un-shaded circles 58(P). In contrast, other pads 58 are configured to carry a ground signal G (e.g., pads 58 which connect to ground or reference planes of the circuit board structure 22) and are shown in FIG. 2 as shaded circles 58(G). It should be understood that other pads 58, which are configured to carry data signals, are disposed around the periphery of the pads 58 shown in FIG. 2 and were purposefully omitted from FIG. 2 for simplicity.

As shown in FIG. 2, the pads 58 reside in a two-dimensional array 60 which generally mirrors the shape of the IC device 24. In particular, the power pads 58(P) and ground pads 58(G) alternate within the two-dimensional array 60 in both the X-direction and the Y-direction. Such alternation enables the IC devices 24 to have alternating power and ground contacts (e.g., solder balls, columns, pins, etc.) thus minimizing package loop inductance and improving signal integrity. That is, every power contact within the interface 32 of the IC device 24 generally has four directly adjacent ground pins. Accordingly, the magnetic flux generated by mutual inductance is capable of canceling the magnetic flux generated by self inductance thus leading to minimal loop inductance for improved signal conditioning.

In support of such interleaving between the power pads 58(P) and the ground pads 58(G), the vias 54 reside in a two-dimensional array as well with alternating columns (along the Y-axis) of the power pads 58(P) and the ground pads 58(G). Accordingly, every power via 54 generally has at least two directly adjacent ground vias 54. It should be understood that the 45 angles of the surface traces 56 provide a zig-zagging pattern that enables convenient connection of the power pads 58(P) and corresponding vias 54 in a cohesive manner, and similar convenient connection of the ground pads 58(G) and corresponding vias 54 in a cohesive manner. Further details of the invention will now be provided with reference to FIG. 3.

Figure 3:
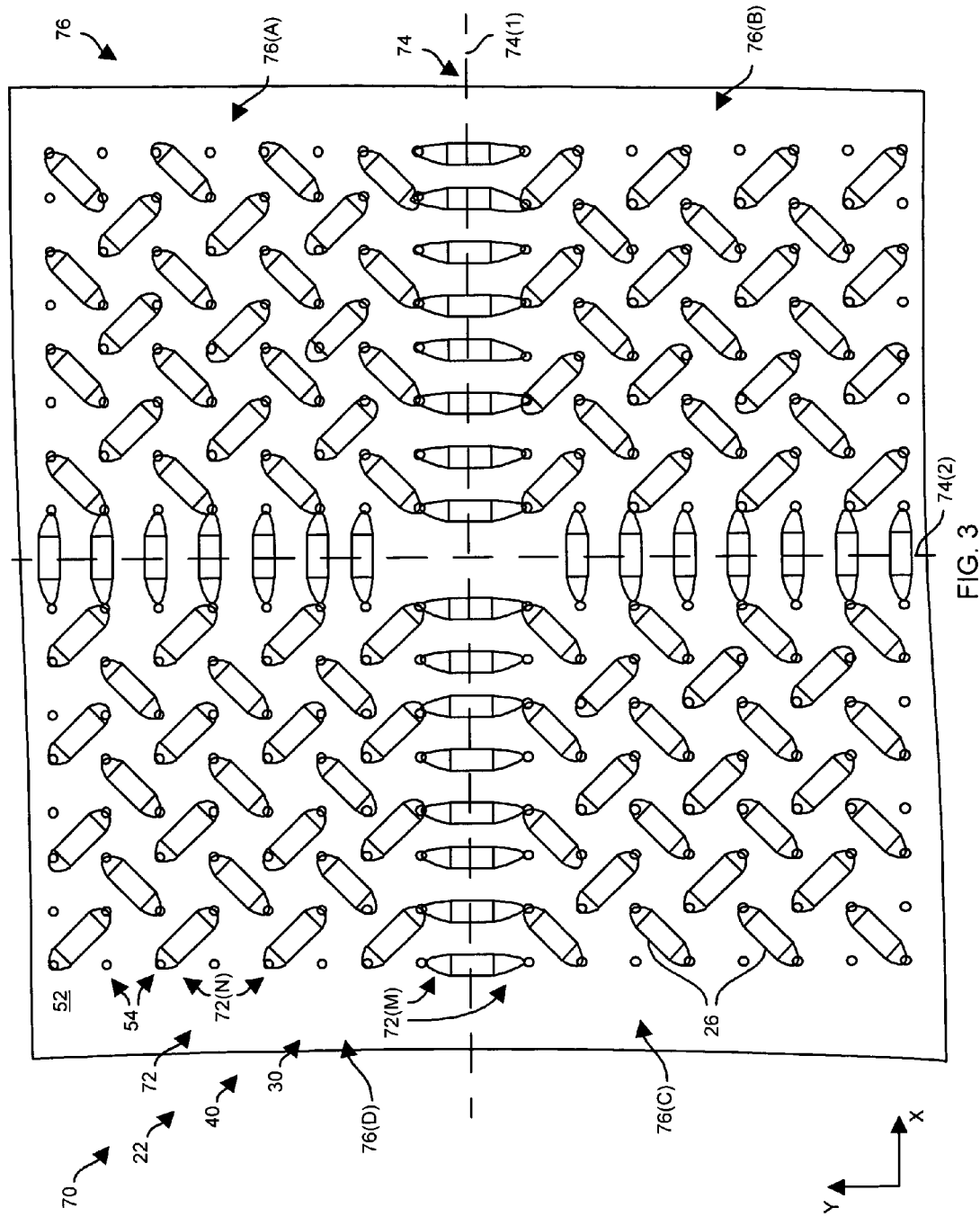
FIG. 3 is a bottom view of an area of the circuit board structure which is opposite the component mounting location of FIG. 2.

FIG. 3 is a bottom view 70 of the area 40 of the circuit board structure 22 (i.e., a bottom layer power/ground pin fanout scheme). As shown in FIG. 3, the circuit board structure 22 further includes bottom pads 72 which reside on the bottom surface 30 of the circuit board structure 22 (also see FIG. 1) and which connect to the vias 54. In some arrangements, surface traces connect the bottom pads 72 to the vias 54. In another arrangements, the bottom pads 72 connect directly to the vias 54, e.g., using a via-in-pad configuration. Other arrangements use both surface traces and via-in-pad configurations to connect the bottom pads 72 to the vias 54.

The bottom pads 72 are configured to solder to the discrete components 26 (e.g., using an SMT process, also see FIG. 1). For illustration purposes only, the discrete components 26 are shown in FIG. 3 as already soldered to the bottom pads 72 such that the fillets of the solder joints generally mirror the shapes of the pads 72. As shown in FIG. 3, some bottom pads 72(M) define mid-lines 74 through the area 40. In particular, a first mid-line 74(1) laterally or horizontally through the area 40 (e.g., in the X-direction). Additionally, a second mid-line 74(2), which is substantially perpendicular to the mid-line 74(1) extends longitudinally or vertically through the area 40 (e.g., in the Y-direction). As a result, the mid-lines 74 divide the area 40 into four quadrants 76(A), 76(B), 76(C), 76(D) (collectively, quadrants 76).

As further shown in FIG. 3, the configuration of bottom pads 72(M) along the mid-lines 74 in combination with the assignment of power and ground signals to the bottom pads 72(M) enables placement of discrete components 26 along and across the mid-lines 74. In particular, the discrete components 26 soldered to the bottom pads 72(M) along the mid-line 74(1) orient such that they cross the mid-line 74(1), i.e., the discrete components 26 along the mid-line 74(1) are substantially perpendicular to the mid-line 74(1). Similarly, the discrete components 26 soldered to the bottom pads 72(M) along the mid-line 74(2) orient such that they cross the mid-line 74(2), i.e., the discrete components 26 along the mid-line 74(2) are substantially perpendicular to the mid-line 74(2). In the context of decoupling capacitors (e.g., 0402 packaged capacitors) as the discrete components 26, more decoupling capacitors are capable of being positioned within the area 40 along these mid-line areas than compared to conventional schemes in which decoupling capacitors extend in a parallel manner to the mid-lines. Since more decoupling capacitors reside in the area 40 of the circuit board structure 22 vis-à-vis conventional schemes, the circuit board structure 22 benefits by receiving improved power signal conditioning.

Additionally, in contrast to the bottom pads 72(M), some bottom pads 72(N) orient at substantially 45 degrees relative to the mid-lines 74 and to the sides of the IC device 24 (also see FIG. 1). These 45 degree orientations of the bottom pads 72(N) enable placement of some discrete components 26 within the quadrants 76. In the context of decoupling capacitors (e.g., 0402 packaged capacitors) as the discrete components 26, even more decoupling capacitors are capable of being positioned within the area 40 compared to conventional schemes that omit decoupling capacitors in the quadrant areas. Again, this increase in the number of decoupling capacitors in the area 40 of the circuit board structure 22 vis-à-vis conventional schemes, the circuit board structure 22 benefits from further improved power signal conditioning.

Figure 4:
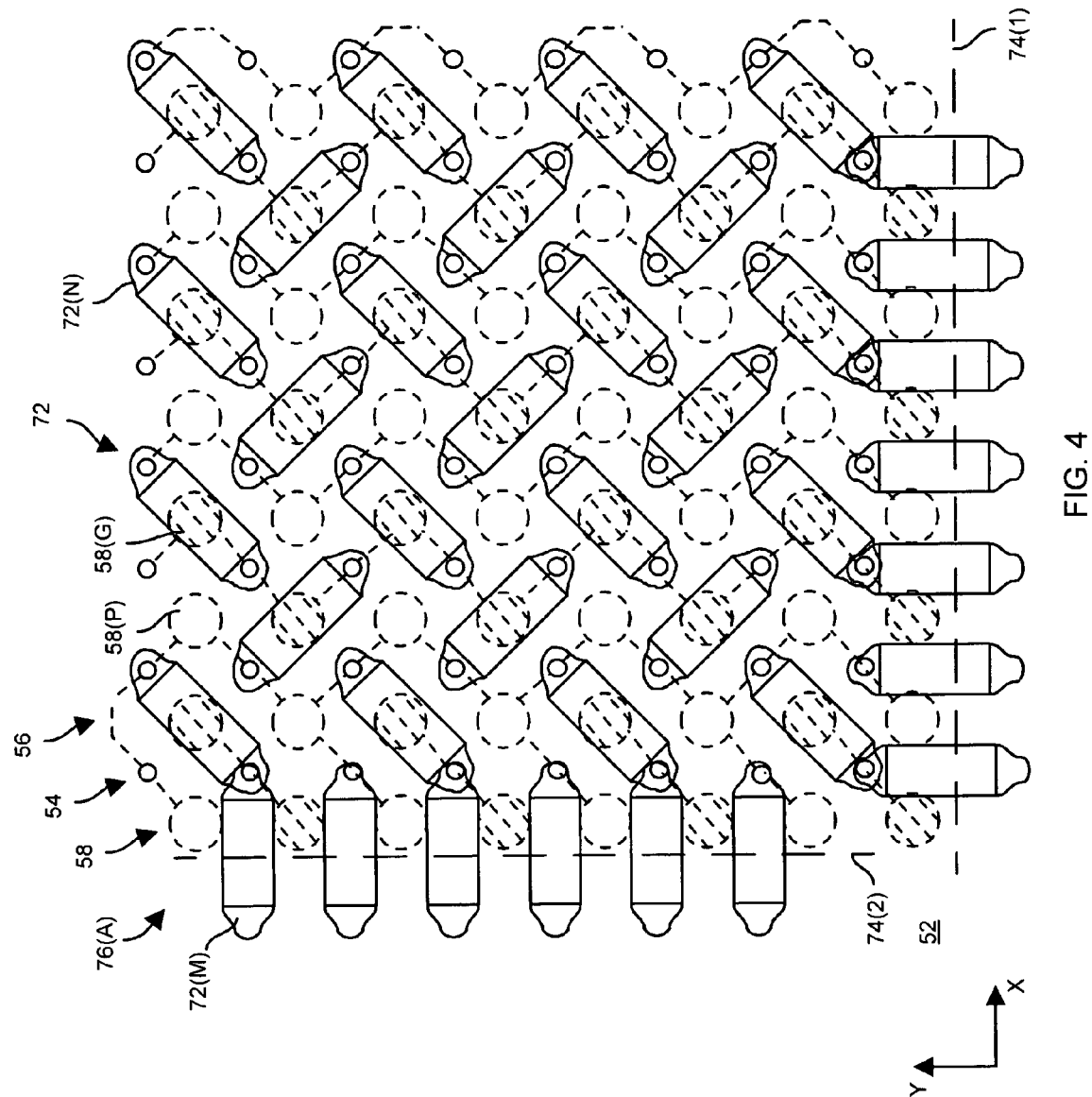
FIG. 4 is a detailed view of a portion of the bottom view of FIG. 3 with particular circuit board features of the component mounting location of FIG. 2 shown in phantom.

FIG. 4 is a detailed view of a quadrant 76(A) of the bottom view 70 of FIG. 3. The top pads 58 and surface traces 56 of the mounting location 36 from the top surface 28 are shown in phantom. From the illustration of FIG. 4, it should be clear that the terminals of the discrete components 26 connect very closely to the power and ground vias 54 and pads 58(P), 58(G). This layout for the circuit board structure 22 is extremely well-suited to support a large number and high density of decoupling capacitors as the discrete components 26 in the area 40 which is beneath and opposite the mounting location 36 of the IC device 24. As a result, the IC device 24 enjoys enhanced power signal conditioning from the discrete components 26 (i.e., decoupling capacitors) which is superior to conventional schemes that position only a few decoupling capacitors along mid-line areas.

It should be clear by close inspection of FIG. 4, that every power/ground via 54 in the quadrant 76(A) has at least one decoupling capacitor connected to it for enhanced power signal conditioning. This is also the situation in all other quadrants 76(B), 76(C), 76(D). Accordingly, the circuit board structure 22 concurrently enjoys (i) enhanced noise reduction due to placement of many decoupling capacitors as the discrete components 26, (ii) minimal total package loop inductance due to interleaving of power and ground pins, and (iii) minimal via inductance due to interleaving of the power and ground vias 54 in one dimension (i.e., interleaving of columns of power vias 54 and ground vias 54 along the X-direction of FIG. 4). That is, simultaneous optimal decoupling capacitor, via and pad placements are achieved by the circuit board structure 22 for improved package power integrity performance.

By way of example only, the discrete components 26 are homogenously 0402 decoupling capacitors. Variations are suitable for use as well such as using other package sizes (e.g., 0201, 0604, 0805, etc.) and/or other types of discrete components (e.g., diodes, resistors, etc.). Further details of the invention will now be provided with reference to FIG. 5.

Figure 5:
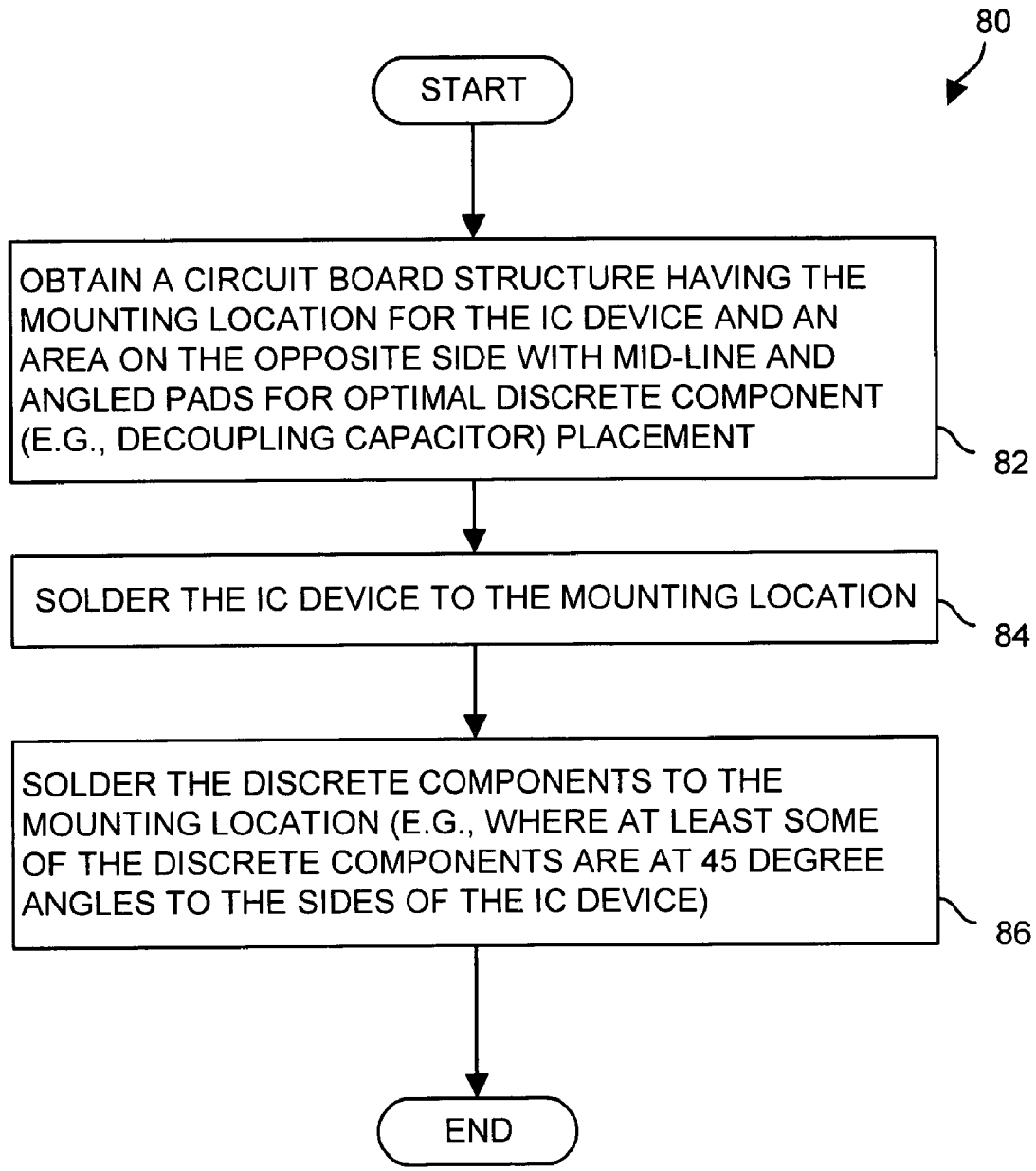
FIG. 5 is a flowchart of a procedure which is performed by a manufacturer of the circuit board module of FIG. 1.

FIG. 5 is a flowchart of a procedure 80 which is performed by a manufacturer of the circuit board module 20. In step 82, the manufacturer obtains the circuit board structure 22 (FIG. 1). As mentioned earlier, the circuit board structure 22 includes top pads 58 in a component mounting location 36 on the top surface 28, and mid-line bottom pads 72(M) and angled bottom pads 72(N) in an area 40 on the bottom surface 40 underneath the mounting location 36 (FIGS. 2 through 4).

In step 84, the manufacturer solders the IC device 24 (e.g., a BGA device) to the mounting location 36. In particular, the manufacturer prints solder paste over the top pads 58 and places the interface 32 of the IC device 24 in contact with the printed solder paste and then heats the solder paste to solder the IC device 24 to the circuit board structure 22 (see the arrow 38 in FIG. 1).

In step 86, the manufacturer solders the discrete components 26 to the area 40. In particular, the manufacturer prints solder paste over the bottom pads 72(M), 72(N) and places the discrete components 26 in contact with the printed solder paste and then heats the solder paste to solder the discrete components 26 to the circuit board structure 22 (see the arrow 40 in FIG. 1). As a result, at least a group of the discrete components 26 orients substantially at 45 degree angles relative to sides of the IC device 24 device thus enabling many discrete components (e.g., 0402 packaged decoupling capacitors) to reduce noise components within power supply signals conveyed to the IC device 24 on the opposite side of the circuit board structure 22.

It should be understood that steps 84 and 86 can be performed in any order. For example, step 86 can be performed first in order to solder the discrete components 26 to the circuit board structure 22 using high temperature solder. Accordingly, lower temperature solder can be used to solder the IC device 24 thus avoiding significant reflow of the high temperature solder joints holding the discrete components 26 to the circuit board structure 22.

As mentioned above, embodiments of the invention are directed to techniques involving the use of angled pads 72(N) which solder discrete components 26 substantially at 45 degree angles relative to sides of an IC device 24. The use of these angled pads 72(N) enables positioning of decoupling capacitors in locations other than simply within the horizontal and vertical gaps on the undersides of circuit boards opposite the mounting locations of complex IC devices. For example, decoupling capacitors are now capable of residing within quadrants 76 defined by these mid-lines 74 thus enabling circuit board manufacturers to mount more decoupling capacitors for improved power supply signal conditioning. Furthermore, the surface traces 56 connecting these angled pads to their corresponding vias are capable of being arranged so that power and ground vias 54 can be interleaved in an extended manner thus minimizing the total loop inductance for circuit boards.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that surface traces 56 were omitted from the top surface 28 of the circuit board structure 22 in the mid-line areas denoted by the mid-lines 74 in FIG. 3 by way of example only. In other arrangements, surface traces 56 extend through these mid-line areas on the top surface 28 (e.g., surface traces 56 which interconnect power vias 54 and pads 58 across the different quadrants 76, surface traces 56 which interconnect ground vias 54 and pads 58 across the different quadrants 76, etc.). Such modifications and enhancements are intended to belong to various embodiments of the invention.

What is claimed is:

1. A circuit board module, comprising:
    an integrated circuit device;
    discrete components; and
    a circuit board structure in electrical communication with the integrated circuit device and the discrete component, the circuit board structure including:
        non-conductive material defining a top surface of the circuit board structure and a bottom surface of the circuit board structure;
        vias supported by the non-conductive material;
        top pads electrically coupled to the vias, the top pads being disposed along the top surface of the circuit board structure and being soldered to the integrated circuit device; and
        bottom pads electrically coupled to the vias, the bottom pads being disposed along the bottom surface of the circuit board structure and being configured to solder to the discrete components, the bottom pads including a group of angled bottom pads which is soldered to a group of the discrete components substantially at 45 degree angles relative to sides of the integrated circuit device.

2. The circuit board module of claim 1 wherein the bottom pads reside in an area of the bottom surface that is opposite to the top pads, and wherein the bottom pads further include:
    a group of mid-line bottom pads which defines a lateral mid-line through the area and a longitudinal mid-line through the area, the lateral and longitudinal mid-lines being substantially perpendicular to each other to divide the area into four quadrants, the group of angled bottom pads being distributed within the four quadrants.

3. The circuit board module of claim 2 wherein the pads are arranged in an array having rows and columns, the pads along each row being individually configured to carry one of a power signal and a ground signal in an interleaving manner.

4. The circuit board module of claim 3 wherein the pads include peripheral pads which reside around a periphery of the array and non-peripheral which reside within the periphery of the array, wherein each non-peripheral pad which is individually configured to carry the power signal is immediately adjacent exactly four pads individually configured to carry the ground signal, and wherein each non-peripheral pad which is individually configured to carry the ground signal is immediately adjacent exactly four pads individually configured to carry the power signal.

5. The circuit board module of claim 2 wherein the group of mid-line bottom pads includes:
   a first set of mid-line bottom pads configured to solder to discrete components crossing the lateral mid-line in a substantially perpendicular manner to the lateral mid-line; and
   a second set of mid-line bottom pads configured to solder to discrete components crossing the longitudinal mid-line in a substantially perpendicular manner to the longitudinal mid-line.

6. The circuit board module of claim 2, further comprising:
   surface traces connecting the bottom pads to the vias, the surface traces extending along the bottom surface substantially at 45 degree angles relative to sides of the integrated circuit device when the integrated circuit device solders to the top pads.

7. The circuit board module of claim 2 wherein the top pads are surface mount contacts which are configured to solder to an area array package as the integrated circuit device, and wherein the bottom pads are surface mount contacts which are configured to solder to standard 0402 packages as the discrete components.

8. A circuit board module, comprising:
   an integrated circuit device;
   discrete components; and
   a circuit board structure in electrical communication with the integrated circuit device and the discrete component, the circuit board structure including:
      non-conductive material defining a top surface of the circuit board structure and a bottom surface of the circuit board structure;
      vias supported by the non-conductive material;
      top pads electrically coupled to the vias, the top pads being disposed along the top surface of the circuit board structure and being soldered to the integrated circuit device; and
      bottom pads electrically coupled to the vias, the bottom pads being disposed along the bottom surface of the circuit board structure and being configured to solder to the discrete components, the bottom pads including means for soldering to a group of the discrete components substantially at 45 degree angles relative to sides of the integrated circuit device.

9. A circuit board structure, comprising:
   non-conductive material defining a top surface of the circuit board structure and a bottom surface of the circuit board structure;
   vias supported by the non-conductive material;
   top pads electrically coupled to the vias, the top pads being disposed along the top surface of the circuit board structure and being configured to solder to an integrated circuit device; and
   bottom pads electrically coupled to the vias, the bottom pads being disposed along the bottom surface of the circuit board structure and being configured to solder to discrete components, the bottom pads including a group of angled bottom pads configured to orient a group of the discrete components substantially at 45 degree angles relative to sides of the integrated circuit device when the integrated circuit device solders to the top pads and when the discrete components solder to the bottom pads.

10. The circuit board structure of claim 9 wherein the bottom pads reside in an area of the bottom surface that is opposite to the top pads, and wherein the bottom pads further include:
   a group of mid-line bottom pads which defines a lateral mid-line through the area and a longitudinal mid-line through the area, the lateral and longitudinal mid-lines being substantially perpendicular to each other to divide the area into four quadrants, the group of angled bottom pads being distributed within the four quadrants.

11. The circuit board structure of claim 10 wherein the pads are arranged in an array having rows and columns, the pads along each row being individually configured to carry one of a power signal and a ground signal in an interleaving manner.

12. The circuit board structure of claim 11 wherein the pads include peripheral pads which reside around a periphery of the array and non-peripheral which reside within the periphery of the array, wherein each non-peripheral pad which is individually configured to carry the power signal is immediately adjacent exactly four pads individually configured to carry the ground signal, and wherein each non-peripheral pad which is individually configured to carry the ground signal is immediately adjacent exactly four pads individually configured to carry the power signal.

13. The circuit board structure of claim 10 wherein the group of mid-line bottom pads includes:
   a first set of mid-line bottom pads configured to solder to discrete components crossing the lateral mid-line in a substantially perpendicular manner to the lateral mid-line; and
   a second set of mid-line bottom pads configured to solder to discrete components crossing the longitudinal mid-line in a substantially perpendicular manner to the longitudinal mid-line.

14. The circuit board structure of claim 10, further comprising:
   surface traces connecting the bottom pads to the vias, the surface traces extending along the bottom surface substantially at 45 degree angles relative to sides of the integrated circuit device when the integrated circuit device solders to the top pads.

15. The circuit board structure of claim 10 wherein the top pads are surface mount contacts which are configured to solder to an area array package as the integrated circuit device, and wherein the bottom pads are surface mount contacts which are configured to solder to standard 0402 packages as the discrete components.

16. A circuit board structure, comprising:
   non-conductive material defining a top surface of the circuit board structure and a bottom surface of the circuit board structure;
   vias supported by the non-conductive material;
   top pads electrically coupled to the vias, the top pads being disposed along the top surface of the circuit board structure and being configured to solder to an integrated circuit device; and
   bottom pads electrically coupled to the vias, the bottom pads being disposed along the bottom surface of the circuit board structure and being configured to solder to discrete components, the bottom pads including means for orienting a group of the discrete components substantially at 45 degree angles relative to sides of the integrated circuit device when the integrated circuit device solders to the top pads and when the discrete components solder to the bottom pads.

* * * * *